United States Patent [19]

Kawano

[11] Patent Number: 5,065,402
[45] Date of Patent: Nov. 12, 1991

[54] TRANSVERSE-MODE STABILIZED LASER DIODE

[75] Inventor: Hideo Kawano, Tokyo, Japan
[73] Assignee: NEC Corporation, Tokyo, Japan
[21] Appl. No.: 648,854
[22] Filed: Jan. 31, 1991

[30] Foreign Application Priority Data

Jan. 31, 1990 [JP] Japan .................................. 2-23483

[51] Int. Cl.[5] ............................................. H01S 3/19
[52] U.S. Cl. ...................................... 372/46; 372/45; 357/17
[58] Field of Search .............. 372/45, 46, 47; 357/16, 357/17

[56] References Cited

U.S. PATENT DOCUMENTS 4,893,313  1/1990  Hatakoshi et al. ..................... 372/45
4,982,409  1/1991  Kinoshita et al. ..................... 372/46

OTHER PUBLICATIONS

"High Power Operation of InGaP/InAlP Transverse Mode Stabilized Laser Diodes", Abstract of Papers for the 1987 Fall Meeting of Japan Society for Applied Physics, p. 764, 19a-ZR-5.

Primary Examiner—Georgia Epps
Attorney, Agent, or Firm—Burns, Doane, Swecker & Mathis

[57] ABSTRACT

A transverse mode stabilized AlGaInP visible light laser diode in accordance with the present invention has a characteristic in that, instead of forming a built-in refractive index distribution in an active layer along a junction plane by means of the absorption loss of the oscillated light in the conventional transverse mode stabilized AlGaInP laser diodes, an optical guide layer having a ridge stripe portion is formed on the active layer, and a refractive index distribution is formed by the thickness difference of the optical guide layer. In particular, the present laser diode employs as the current blocking layer to be formed on the sides of the mesa, an $Al_xGa_{1-x}As$ layer which does not give rise to an absorption loss of the oscillated light.

6 Claims, 1 Drawing Sheet

TRANSVERSE-MODE STABILIZED LASER DIODE

BACKGROUND OF THE INVENTION

The present invention relates to transverse-mode stabilized laser diodes, and more particularly to ridge stripe AlGaInP visible light laser diodes with oscillation wavelength not greater than 680 nm.

AlGaInP visible light laser diodes are attractive light sources for optical information processing systems such as laser printers, barcode readers, and optical disc systems. A conventional transverse-mode stabilized AlGaInP visible light laser diode is shown in FIG. 1 as reported in the Abstract of Papers for '87 Fall Meeting of the Japan Society of Applied Physics, p. 764, 19a-ZR-5.

Referring to FIG. 1, an n-GaAs buffer layer 2 is formed on an n-GaAs substrate 1. On top of the buffer layer 2 there is formed a double heterojunction structure consisting of an n-AlGaInP cladding layer 3, a GaInP active layer 4, a ridge stripe p-AlGaInP cladding layer 5, a p-GaInP cap layer 6, a pair of n-GaAs current blocking layers 7 and a p-GaAs contact layer 8.

Here, the fabrication step of the conventional structure shown in FIG. 1 will be described. First, a five-layer structure from the n-GaAs buffer layer 2 to the p-GaInP cap layer 6 is formed sequentially by a first vapor phase growth. Subsequently, a stripe-shaped mask using a 5 μm-width SiO$_2$ film is formed on the cap layer 6 by photoetching, and a ridge stripe structure is formed by etching the p-AlGaInP cladding layer 5 halfway. Next, the n-GaAs current blocking layers 7 are formed selectively on the mesa part except for the stripe-shaped SiO$_2$ film mask by a second vapor phase growth. Then, after the removal of the SiO$_2$ film mask, the p-GaAs contact layer 8 is grown all-over the surface by a third vapor phase growth, a p-side ohmic electrode 9 of AuZn/Au is formed on the contact layer 8 and an n-side ohmic electrode 10 of AuGe/Au is formed on the GaAs-substrate 1.

In this prior art structure, the current contraction is achieved by the n-GaAs current blocking layers 7. Further, the p-GaInP cap layer 6 plays the role of preventing the increase of the electrical resistance caused by the band discontinuity between the p-AlGaInP cladding layer 5 and the p-GaAs contact layer 8.

On the other hand, the transverse-mode stabilization is achieved by the formation of a refractive index distribution in the active layer 4 along a function plane in the direction perpendicular to an optical axis of the laser diode by utilizing the light absorption loss caused by the n-GaAs current blocking layers 7 at thinned peripheral portions of the p-AlGaInP cladding layer 5.

In recent years there are increasing demands for refractive index guided type laser diodes that can be operated in the fundamental transverse mode and has a low oscillation threshold and a low astigmatism.

However, in the conventional refractive index guided type laser diodes as described above, since the built-in effective refractive index distribution in the active layer 4 along a junction plane is formed by the light absorption loss caused by the n-GaAs current blocking layer 7, the oscillation threshold current is high and the astigmatism is a relatively large value of 10–13 μm, leading to a drawback that it is not easy to narrow down the laser beam to a minute spot.

Moreover, due to the necessity for making the thickness of the p-AlGaInP cladding layer 5 at both sides of the ridge or mesa portion to a small value in the range of 0.1 to 0.2 μm, the active layer 4 under both sides of the mesa portion undergoes a thermal damage during the formation of the n-GaAs current blocking layer 7 by a second vapor phase growth, and thus the life-time of the laser diodes is shortened.

SUMMARY OF THE INVENTION

Therefore, an object of the present invention is to provide highly reliable transverse mode stabilized AlGaInP visible light laser diodes with satisfactory characteristics.

A feature of the laser diodes in accordance with the present invention is to form a built-in refractive index distribution in the active layer along a junction plane by placing a ridge stripe optical guide layer on the active layer such that the refraction index distribution is determined by the thickness difference of the optical guide layer rather than the absorption loss of the oscillated light as is done in the conventional transverse mode stabilized AlGaInP laser diodes.

Further, the laser diodes in accordance with the present invention employs an $Al_xGa_{1-x}As$ current blocking layers formed on the sides of the mesa or ridge portion that does not cause the oscillated light to suffer from an absorption loss, and is easy to grow the crystal.

DESCRIPTION OF THE PREFERRED EMBODIMENTS

Embodiment 1

Figure 1:
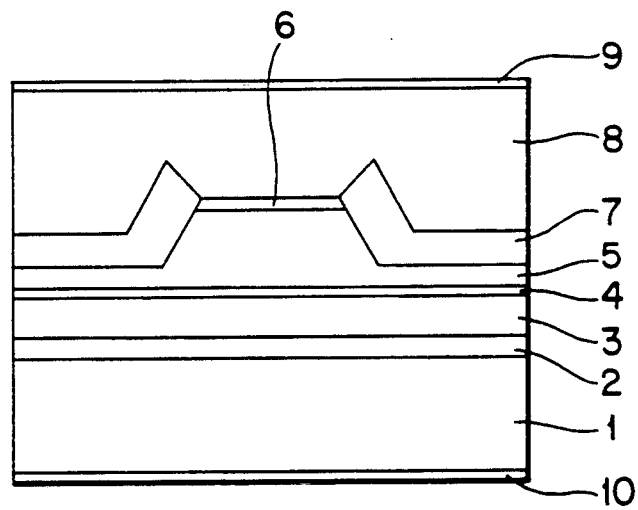
FIG. 1 is a transverse sectional view showing an example of the prior art laser diodes.
Figure 2:
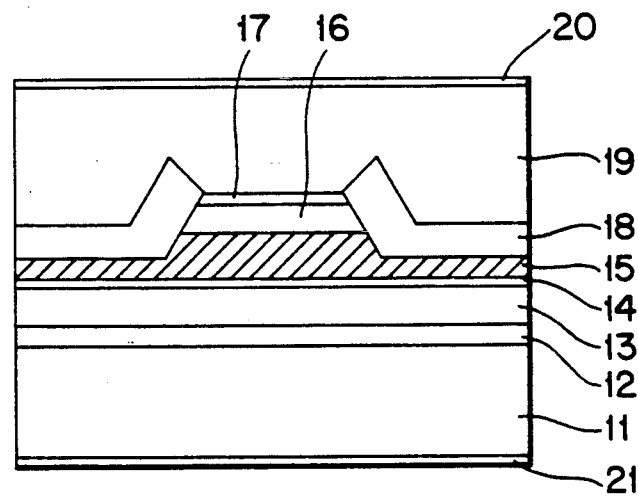
FIG. 2 is a transverse sectional view showing a first embodiment of the AlGaInP laser diode of the present invention.

First, referring to FIG. 2, by a low pressure metalorganic vapor phase epitaxy (MOVPE) method that uses group III organic metals (trimethylindium, triethylgallium and trimethylaluminum) and group V hydrides (PH$_3$ and AsH$_3$) as the raw materials there is formed a double heterowafer by sequentially forming, on an n-GaAs substrate 11 (with electron concentration of $2 \times 10^{18}$ cm$^{-3}$) with (100) surface orientation, a 0.5 μm-thick n-GaAs buffer layer 12 (with electron concentration of $1 \times 10^{17}$ cm$^{-3}$), a 1 μm-thick n-(Al$_{0.6}$Ga$_{0.4}$)$_{0.5}$In$_{0.5}$P cladding layer, a 0.06 μm-thick Ga$_{0.5}$In$_{0.5}$P active layer 14, a 1 μm-thick p-(Al$_{0.4}$Ga$_{0.6}$)$_{0.5}$In$_{0.5}$P optical guide layer 15 (with hole concentration of $3 \times 10^{17}$ cm$^{-3}$), a 0.7 μm-thick p-(Al$_{0.6}$Ga$_{0.4}$)$_{0.5}$In$_{0.5}$P cladding layer 16 (with hole concentration of $3 \times 10^{17}$ cm$^{-3}$) and a 0.05 μm-thick p-Ga$_{0.5}$In$_{0.5}$P cap layer 17 (with hole concentration of $1 \times 10^{18}$ cm$^{-3}$). Subsequently, a 5 μm-wide stripelike SiO$_2$ mask film (not shown) is formed on the cap layer 17 by photoetching.

Next, as shown in FIG. 2, the optical guide layer 15 is etched up to a halfway by the use of a mixed solution of H$_3$PO$_4$, H$_2$O$_2$ and H$_2$O, and an etchant H$_2$SO$_4$ to control the thickness of the optical guide layer 15 on both sides of the stripe-shaped mesa portion to be 0.3 to 0.5 μm.

Then, a 0.6 μm-thick (at the flat portion) n-Al$_{0.7}$Ga$_{0.3}$As current blocking layers 18 (with electron concentration of $1 \times 10^{18}$ cm$^{-3}$) is selectively grown on the mesa part except for the stripe-shaped SiO$_2$ film mask by a second MOVPE growth. Next, after removal of the SiO$_2$ film mask, a 3 μm-thick p-GaAs contact layer 19 (with hole concentration of $5 \times 10^{18}$ cm$^{-3}$) is grown all-over the surface by a third MOVPE growth, and a laser diode is completed by forming a p-side ohmic electrode 20 of AuZn/Au on the contact layer 19 and an n-side ohmic electrode 21 of AuGe/Au on the n-GaAs substrate 11, and by forming reflecting end faces by cleavage.

It should be noted here that the composition of the n-Al$_{0.7}$Ga$_{0.3}$As current blocking layer 18 is regulated such that its energy band gap is larger than that of the active layer 14 so as not to cause absorption loss of light generated from the active layer, and its refractive index is selected to be smaller than that of the optical guide layer 15 so as to trap the light into the optical guide layer 15. Accordingly, the n-Al$_{0.7}$Ga$_{0.3}$As current blocking layers 18 act mainly for current contraction for carrying out an efficient current injection to the ridge stripe mesa portion. In addition, the current blocking layers have the same function of the p-(Al$_{0.6}$Ga$_{0.4}$)$_{0.5}$In$_{0.5}$P cladding layer 16 in view of trapping light within the optical guide layer 15. To this end, refractive index of the current blocking layers 18 is selected to be substantially equal to that of the cladding layer 16. For these reasons, Al composition rate x of the current blocking layers is selected to be 0.7 or more.

Moreover, there can be obtained a distribution of effective refractive index difference with real number component which is free from absorption loss since the built-in effective refractive index difference in the active layer 14 along the junction plane is determined by the thickness difference of the optical guide layer 15. The thickness of the mesa portion is selected to be about twice of that of both sides of the mesa portion so as to obtain the effective refractive index difference of $6 \times 10^{-3}$ to $2 \times 10^{-2}$.

Therefore, it becomes possible to realize a refractive index guided type transverse mode stabilization which has a low oscillation threshold current and a low astigmatism. For example, conventional threshold current of 50 mA is decreased to about 40 mA and low astigmatism of 2 μm or less can be achieved. Furthermore, the life time of the laser diode can be extended due to large thickness of the optical guide layer at flat peripheral region.

Embodiment 2

Figure 3:
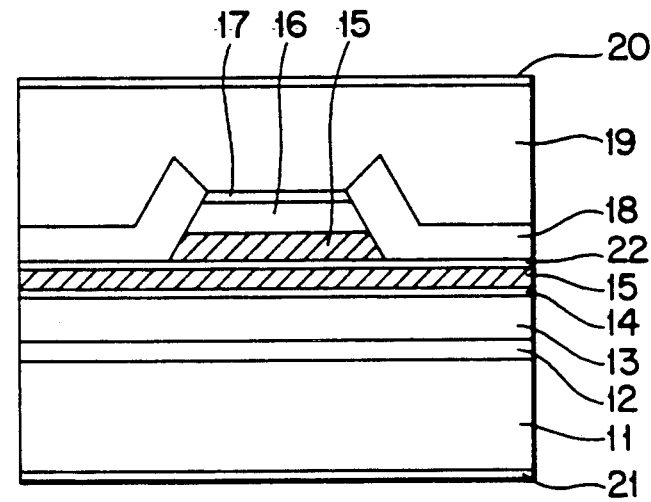
FIG. 3 is a transverse sectional view showing a second embodiment of the AlGaInP laser diode of the present invention.

FIG. 3 is a transverse sectional view of a second embodiment of the present invention. The growth of a double hetero-structure by an MOVPE method is carried out by the same method as in the first embodiment described above.

This embodiment differs from the first embodiment in that after growing a p-(Al$_{0.4}$Ga$_{0.6}$)$_{0.5}$In$_{0.5}$P optical guide layer 15 with thickness of 0.3 to 0.4 μm on an active layer 14 by a first MOVPE method, a 40Å-thick p-Ga$_{0.5}$In$_{0.5}$P etching stopper layer 22 (with hole concentration $3 \times 10^{17}$ cm$^{-3}$) is grown, and the optical guide layer 15 is formed to a thickness of 0.7 μm. In other respects it is the same as in the first embodiment.

This embodiment has an advantage that the thickness of the light guide layer 15 on both sides of the mesa portion can be formed with high controllability by the formation of the etching stopper layer 22.

Here, the thickness of the etching stopper layer 22 is made thin to be 40Å so as not to subject the oscillated light to an absorption.

As described in the above, in accordacne with the present invention the built-in effective refractive index difference in the active layer 14 is realized by the thickness of the optical guide layer of the mesa portion and its both sides, so that a refractive index distribution with real number component having no absorption loss can be obtained. Therefore, it is possible to realize a transverse mode stabilized laser diode that has a low oscillation threshold and a low astigmatism and can be operated at the transverse fundamental mode.

Moreover, since it is possible to design the thickness of the optical guide layer 15 on both sides of the mesa portion to have a value of 0.3 to 0.5 μm which is larger than that of the conventional device, there can be formed a highly reliable laser diode having an active layer 14 that has suffered a less thermal damage during the growth of the current blocking layer 18 by a second MOVPE growth.

What is claimed is:

1. A transverse mode stabilized laser diode comprising: a first cladding layer formed on a substrate and having a first conductivity; an active layer formed on said first cladding layer; an optical guide layer of a second conductivity formed on said active layer and having a ridge stripe portion extending along an optical axis of said active layer, a refractive index of said optical guide layer being larger than that of said first cladding layer but smaller than that of said active layer; a second cladding layer of said second conductivity formed on top surface of said ridge stripe portion and having a refractive index smaller than that of said optical guide layer; a pair of current blocking layers of said first conductivity commonly formed on said optical guide layer exposed from said second cladding layer and side surface of said second cladding layer, said current blocking layers having an energy band gap larger than that of said active layer and having a refractive index smaller than that of said optical guide layer; a contact layer of said second conductivity commonly formed on said current blocking layers and said second cladding layer; and a pair of electrodes provided on said contact layer and bottom of said substrate.

2. The transverse mode stabilized laser diode as claimed in claim 1, further comprising an etching stopper layer provided on said optical guide layer other than said ridge stripe portion and extending along said active layer such that said ridge stripe portion is separated from remaining flat optical guide layer and said current blocking layer is spaced apart from said flat optical guide layer.

3. The transverse mode stabilized laser diode as claimed in claim 1, wherein the thickness of said optical guide layer at said ridge stripe portion is selected to be about twice of that at outside thinned flat region thereof.

4. A transverse mode stabilized visible light laser diode comprising: a substrate of GaAs having a first conductivity type; a buffer layer of GaAs formed on said substrate and having said first conductivity type; a first cladding layer of AlGaInP formed on said buffer layer and having said first conductivity type; an active layer formed on said first cladding layer; an optical guide layer of AlGaAsP formed on said active layer and having a second conductivity type; said optical guide layer having a mesa structure whose thickness along the central part is larger than that of the peripheral parts on both sides; a second cladding layer of AlGaInP formed on the central part of said light guide layer and having said second conductivity type; a cap layer of GaInP formed on said second cladding layer and having said second conductivity type; a current blocking layer of AlGaAs formed commonly over the peripheral parts and the side face parts of said light guide layer, the side face parts of said second cladding layer and the side face parts of said cap layer and having said first conductivity type; a contact layer of GaAs formed commonly over the top surface of said cap layer and the surface of said current blocking layer and having said second conductivity; a first electrode layer formed on said contact layer; and a second electrode layer formed on the bottom surface of said substrate.

5. A visible light laser diode as claimed in claim 4, wherein the value of x when said current blocking layer is represented by $Al_xGa_{1-x}As$, satisfies the condition $x \geq 0.7$.

6. A visible light laser diode as claimed in claim 5, wherein said active layer is $(Al_yGa_{1-y})_{0.5}In_{0.5}P$ ($0 \leq y \leq 1$), said first cladding layer is $(Al_zGa_{1-z})_{0.5}In_{0.5}P$ ($0 \leq z \leq 1$) and said optical guide layer is $(Al_wGa_{1-w})_{0.5}In_{0.5}P$ ($0 \leq w \leq 1$), where there is satisfied a relation $z > w > y$.

* * * * *